(12) United States Patent
Giuroiu (10) Patent No.: US 9,264,038 B2
(45) Date of Patent: Feb. 16, 2016

(54) LINE RECEIVER CIRCUIT WITH ACTIVE TERMINATION

(71) Applicant: Texas Instruments, Inc., Dallas, TX (US)

(72) Inventor: Horia Giuroiu, Campbell, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 20 days.

(21) Appl. No.: 14/190,808

(22) Filed: Feb. 26, 2014

(65) Prior Publication Data
US 2015/0244363 A1 Aug. 27, 2015

(51) Int. Cl.
*H03M 1/66* (2006.01)
*H03K 19/00* (2006.01)
*H03H 11/30* (2006.01)

(52) U.S. Cl.
CPC .......... *H03K 19/0005* (2013.01); *H03H 11/30* (2013.01)

(58) Field of Classification Search
CPC .................................................. H03K 19/0005
See application file for complete search history.

(56) References Cited

U.S. PATENT DOCUMENTS

| | | | | |
|---|---|---|---|---|
| 6,229,396 B1* | 5/2001 | Zabroda | ................... | H03F 1/56 330/195 |
| 6,288,564 B1* | 9/2001 | Hedberg | ............. | H04L 25/0292 326/21 |
| 6,552,565 B2* | 4/2003 | Chang | ................. | H04L 25/0278 326/30 |
| 7,764,210 B2* | 7/2010 | Rentala | .................. | H03H 11/30 341/144 |
| RE41,598 E * | 8/2010 | Chang | ................. | H04L 25/0278 326/30 |
| 7,970,811 B2* | 6/2011 | Shen | ................... | H03H 21/0001 708/819 |
| 2010/0295581 A1* | 11/2010 | Mehdizad Taleie | .... | H03F 1/223 327/108 |

OTHER PUBLICATIONS

Nauta et al. "Analog Line Driver with Adaptive Impedance Matching." IEEE Journal of Solid-State Circuits, vol. 33, No. 12, Dec. 1998.

* cited by examiner

*Primary Examiner* — Jason M Crawford
*Assistant Examiner* — Kurtis R Bahr
(74) *Attorney, Agent, or Firm* — Andy Viger; Frank D. Cimino (57) ABSTRACT

A circuit for receiving digital signals over a transmission line. A feedback circuit is coupled to an input node of the transmission line and adjusts the input impedance of the receiver circuit to match the characteristic impedance of the transmission line. The feedback circuit includes a first current source controlled by a first voltage and having a first transconductance, and a second current source controlled by the first voltage and having a second transconductance equal to the first transconductance times a first scaling factor. The feedback circuit includes a first resistance element having a resistance equal to the first scaling factor plus one, times the characteristic impedance of the transmission line, and is coupled between the outputs of the first and second current sources. Finally, the feedback circuit also includes a differential amplifier that compares the output of the first current source to a reference value then generates the first voltage output to control each of the first and second current sources.

18 Claims, 13 Drawing Sheets

LINE RECEIVER CIRCUIT WITH ACTIVE TERMINATION

TECHNICAL FIELD

The present disclosure relates generally to circuit techniques for receiving electrical signals through a multi-conductor electrical cable, and more particularly, to a circuit for receiving high frequency digital signals over a multi-conductor cable.

BACKGROUND

A multi-conductor electrical cable is often used to communicate electrical signals, such as audio and video signals, from one electronic device to another. In a common application, modern smartphones include a female audio jack for receiving a male plug configured at one end of a cable from an external device, such as a headset, to facilitate analog voice and audio communications. It is also possible to use a multi-conductor cable for sending and receiving digital data between digital devices at high frequencies, e.g., exceeding 10 MHz, thereby providing enhanced features and more sophisticated control schemes. However, variations in the process, supply voltage and temperature of the receiver circuit elements, herein referred to as PVT variations, create problems for reliably extracting digital data when using such cables. Therefore, it would be desirable to have a receiver circuit that could compensate for PVT variations in the active circuit elements in order to communicate digital data between devices and to obtain reliable data extraction.

DETAILED DESCRIPTION

1. Overview

This disclosure describes a circuit for receiving digital signals over a multi-conductor electrical cable, such as a conventional audio-type cable with 2.5 mm or 3.5 mm plug connectors. The receiver circuit may be employed in one or both digital devices connected by the cable. The receiver circuit is configured to provide active termination and extraction of a digital signal, e.g., data and/or clock signals, with dynamic compensation for variations in the process, supply voltage and temperature of the receiver circuit elements, referred to herein generally as PVT variations.

2. Data Communications Via Standard Audio-Type Cable

Figure 1:
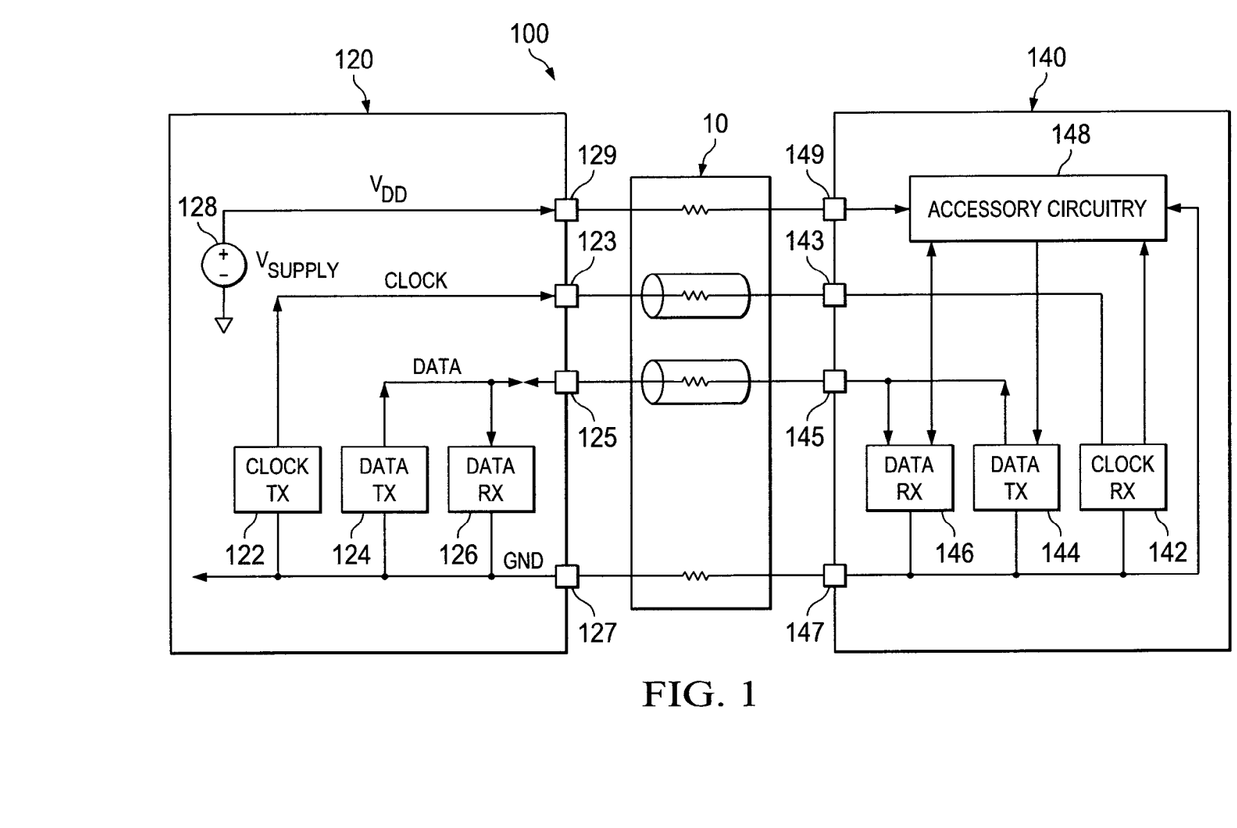
FIG. 1 is a circuit diagram illustrating a first digital device connected with a second digital device by a four-conductor signal cable.

A conventional audio-type multi-conductor cable can be used for digital communications at high frequencies between digital devices. For example, FIG. 1 is schematic representation of a system 100 for data communications between a first digital device 120, such as a smartphone, and a second digital device 140, such as a headset, using a conventional audio-style cable 10. In the illustrated embodiment, the first device 120 acts as a controller for the second device 140, and the second device provides accessory features for the first device. In an alternative embodiment, the first device 120 and second device 140 are equivalent controllers, but one may be configured to act as a master controller while the other acts as a slave device.

The first device 120 includes a clock transmit circuit 122 that generates a clock signal and is coupled by one of the conductors of cable 10 acting as a unidirectional data line to a corresponding clock receive circuit 142 in the second device 140. The first device 120 also includes a data transmit circuit 124 and a data receive circuit 126 that are both coupled by one of the conductors of cable 10 acting as a bidirectional data line to a corresponding data receive circuit 146 and data transmit circuit 144 in the second device 140. Since in this example the first device 120 is considered the controller, it includes a voltage supply 128 for providing power to the second device 140, while the second device includes control circuitry 148 that is powered by the voltage supply and the ground line. This is merely one illustrative example of a data communications system that uses an audio-style cable to connect two devices, and many other configurations are possible.

In this embodiment, the first device 120 includes four connection nodes 123, 125, 127, 129 that provide for external connection to the corresponding lines in the first device 120 for the CLOCK signal, the DATA signal, the GND signal, and the voltage signal $V_{DD}$, respectively. Likewise, the second digital device 140 includes four nodes 143, 145, 147, 149 that provide for external connection to the corresponding lines in the second circuit 140 for the CLOCK signal, the DATA signal, the GND signal, and the voltage signal $V_{DD}$, respectively. Each node is configured for external electrical connection to the wires of cable 10, either by direct connection, or more commonly, by incorporating an external jack (not shown) into the device into which a plug (see FIG. 2) from cable 10 is inserted.

Figure 2:
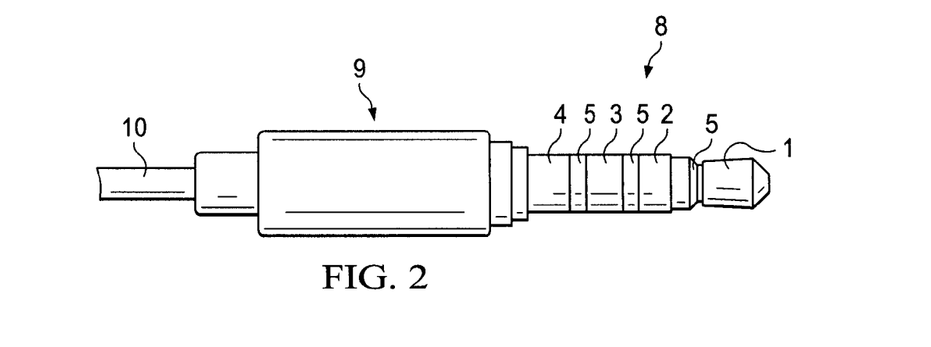
FIG. 2 is side plan view of a TRRS plug.

FIG. 2 is an illustration of a four-conductor cable 10 as terminated into a TRRS (Tip-Ring1-Ring2-Sleeve) connector at one end of the cable. The connector body 9 may be a molded plastic casing formed over a metal plug 8, such as a 3.5 mm mini-phone plug. In an application for a four-wire cable, the conductive tip portion 1 of the plug 8 may be designated for the left audio channel; the conductive first ring portion 2 may be designated for the right audio channel; the conductive second ring portion 3 may be designated for the ground or common line; and the conductive sleeve portion 4 may be designated for either a microphone signal or a video signal. Each of the conductive portions 1-4 of the plug 8 are electrically separated by an insulator portion 5.

In one example of a data communications embodiment, the tip portion 1 and first ring portion 2 are configured for digital data signals, e.g., the CLOCK signal and the DATA signal; the second ring portion is configured for the GND signal; and the sleeve portion is configured for the voltage signal $V_{DD}$. Each data line forms a transmission line with the ground connection. The characteristic impedance $Z_0$ of each transmission line is between 20 to 70 ohms, and the capacitive cross-talk between the data lines can be significant.

Other cable and wire configurations for multi-conductor cables are known, and this disclosure is addressed generally to any such cable having one or more of its conductors used as a transmission line for digital data or clock signals at high frequencies.

3. CMOS Driver and Receiver

Figure 3:
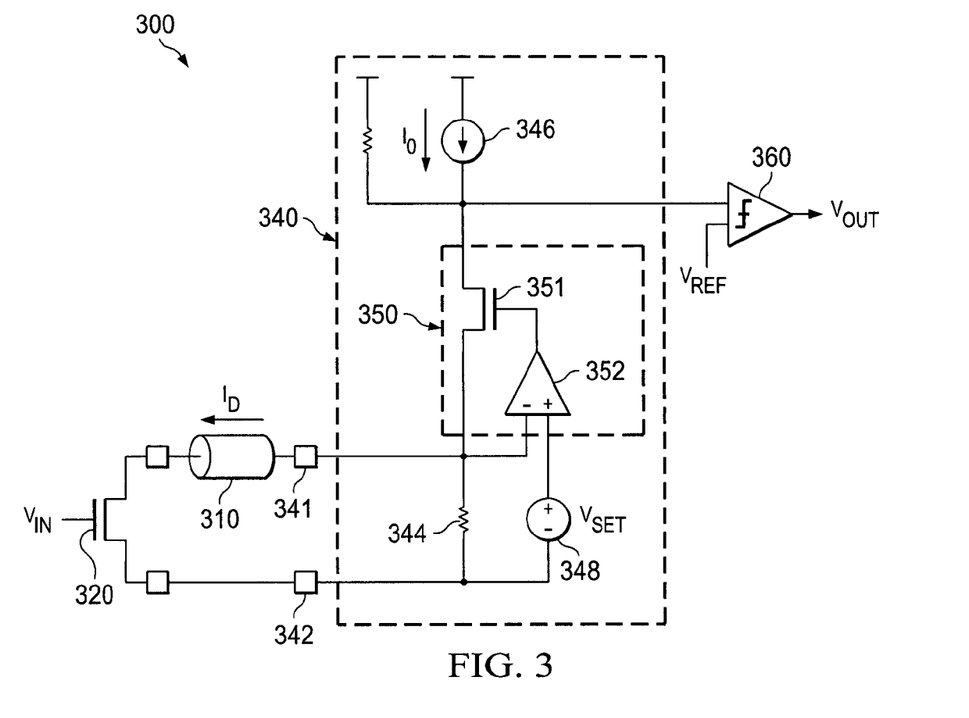
FIG. 3 is a circuit diagram illustrating a circuit for a current mode data link.

FIG. 3 illustrates a circuit 300 that provides a serial data link operating in a current mode as a current sink driver. A transmission line 310 having a characteristic impedance $Z_0$ is coupled between a CMOS line driver 320 and a receiver circuit 340. In order to preserve signal integrity, the input impedance of the receiver circuit 340 should be matched to the characteristic impedance $Z_0$ of the transmission line 310.

The line driver 320 is a field effect transistor that generates current pulses $I_D$ through application of an input voltage $V_{IN}$ to the gate of the transistor, and sends the current pulses over the transmission line 310. The receiver circuit 340 has a first node 341 for receiving the input current pulses $I_D$ through the transmission line 310, and a second node 342 coupled to a ground source or a common source of the transmission line. A pull-down resistor 344 is connected between node 341 and node 342.

The receiver circuit 340 includes a current buffer feedback circuit 350 having a field effect transistor 351 and an amplifier 352 in a boosted cascode configuration. The drain of transistor 351 is coupled to a current source 346, the source of transistor 351 is coupled to the input node 341, and the gate of transistor 351 is coupled to the output of amplifier 352. The inverting input of amplifier 352 is coupled to the input node 341 and the non-inverting input of amplifier 352 is coupled to a DC reference voltage $V_{SET}$ provided by voltage supply 348.

The input current $I_D$ is compared with a reference current $I_0$ and the output slicer 360 generates a voltage $V_{OUT}$ that is indicative of the input current pulses. However, one drawback of this design is that the input impedance remains strongly dependent on the PVT variations described above. In addition, a second drawback is that the minimum voltage of the circuit must be larger that the saturation voltage across the line driver 320. The voltage is set by the feeback loop 350 to $V_{SET}$. However, because the DC voltage across the pull-down resistor 344 is equal to the minimum voltage $V_{DS}$, the power consumption of the circuit is significant.

Figure 4:
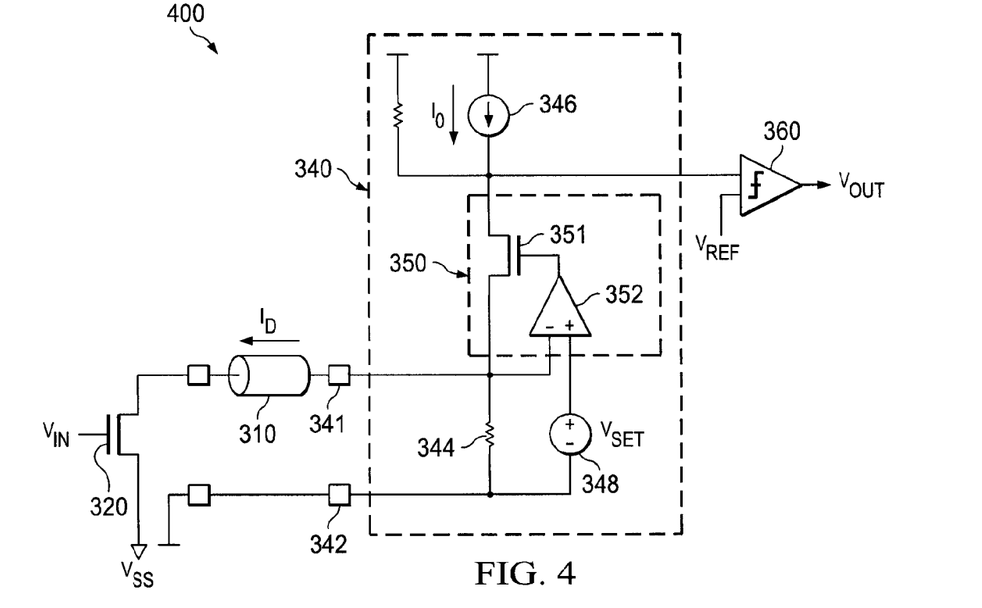
FIG. 4 is a circuit diagram illustrating a circuit for a current mode data link, similar to the circuit shown in FIG. 3, except that the line driver is referenced to a negative voltage source.

FIG. 4 illustrates a circuit 400 that provides one solution to the second problem. Circuit 400 is a variation of circuit 300 shown in FIG. 3, where the line driver 320 is referenced to a negative supply rail $V_{SS}$, and the DC input voltage $V_{SET}$ can be set to 0. However, in this configuration, an additional negative power supply is required, in most cases, only to power the line drivers.

Figure 5:
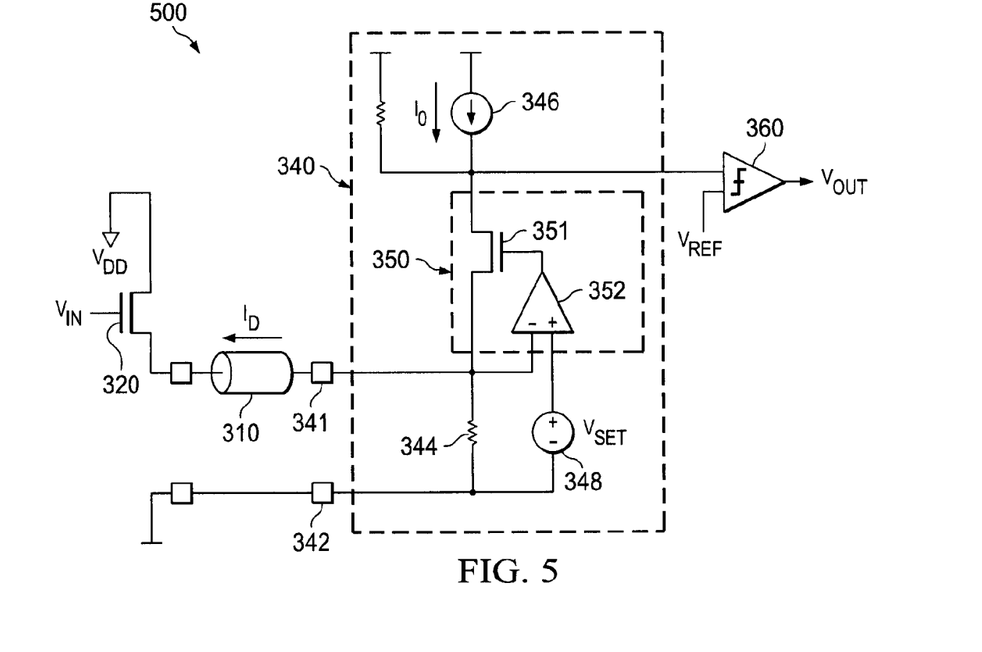
FIG. 5 is a circuit diagram illustrating a circuit for a current mode data link, similar to the circuit shown in FIG. 3, except that the line driver is referenced to a positive voltage source.

FIG. 5 illustrates circuit 500 that provides another solution to the minimum voltage problem. In this embodiment, the minimum input voltage is provided by the line driver 320 sourcing current into a grounded resistor at the input of the receiver. The receiver thus operates like a folded cascode circuit. The DC current through the pull-down resistor 344 should be set to a higher value than the maximum current delivered by the line driver 320.

However, none of circuits 300, 400, 500 solve the problem of PVT dependency.

4. Improved Receiver Configuration

Figure 6:
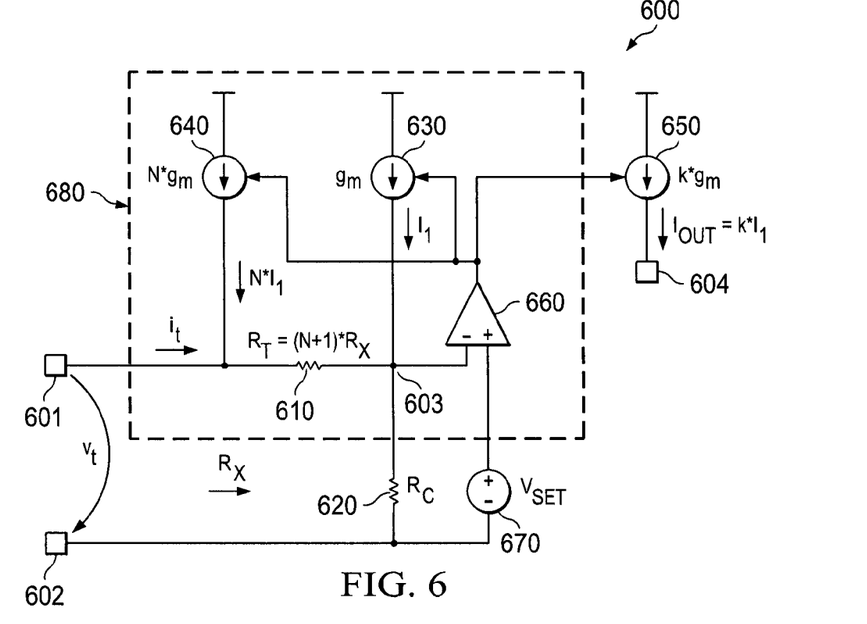
FIG. 6 is a circuit diagram illustrating a receiver circuit for a current mode data link.

FIG. 6 illustrates a receiver circuit 600 adapted for receiving high frequency digital signals over a standard audio-type cable, such as the TRRS cable described above. The receiver circuit 600 effectively 'synthesizes' the input impedance of the circuit by using a pair of ratioed voltage-controlled current sources, one on either side of a resistance element in a feedback loop on the input signal. This configuration enables the feedback loop to adjust the current flowing in the resistance element to thereby modify the input impedance of the receiver to match the characteristic impedance of the audio cable acting as a standard transmission line for the frequencies of interest.

The receiver circuit 600 is connected to a signal wire of the audio cable/transmission line (not shown) at input node 601, and to a common or ground line of the audio cable/transmission line at input node 602. For example, the receiver may be configured with a female jack to receive a male plug from the audio cable, as described above. There may be as many receiver circuits configured in the transmitter and/or receiver as there are digital signals to process. In the most basic example using a TRRS 4-conductor cable configuration, one conductor is used for data, another conductor is used for a clock signal, and a pair of conductors provide power and ground from the control device to the accessory device. The audio cable/transmission line has a known characteristic impedance $Z_0=R_X$ ohms. Thus, the target input impedance for the receiver circuit 600 is also $R_X$ ohms.

A first resistance 610 is connected in series between the input node 601 and an internal node 603, with a value of $R_T=R_X*(N+1)$, where N is an internal scaling factor as further discussed below and $R_X$ is the target impedance A first voltage-controlled current source 630 is connected to the internal node 603 of the receiver circuit 600 and has a transconductance of $g_{m1}=g_m$ mhos. A second voltage-controlled current source 640 is connected to the input node 601, and the second current source has a transconductance of $g_{m2}=N*g_m$ mhos. The combination of the $R_T$ resistance 610 and the transconductance of the first and second current sources 630, 640 is used to set the active input impedance of the receiver circuit 600 with voltage control from the output of differential amplifier 660.

A second resistor 620 having a value of $R_C$ connects the internal node 603 to the input node 602, and is used as a pull-down resistor to set the passive input impedance in conjunction with the $R_T$ resistor 610.

A third voltage-controlled current source 650 is connected to an output node 604 and has a transconductance of $g_{m3}=k*g_m$ mhos, where k is a second scaling factor used for the circuit output. The third current source 650 extracts a scaled version of the input current from the receiver circuit 600 and has a linear dependence on the input current, where k is the selected scaling factor. Each of the current sources 630, 640 650 is grounded from an AC standpoint, but may have a different DC connection to ground or another common line.

The differential amplifier 660 generates a voltage output 661 that is used to control the current sources 630, 640, 650. The first input 662 of the amplifier 660 is coupled to internal node 603. The second input 653 of the amplifier 650 is coupled to a reference voltage $V_{SET}$ generated by voltage source 670.

The combination of resistor 610, current source 630, current source 640 and amplifier 660 form a feedback loop 680 that sets the current $I_1$ generated by the first current source 630 to a value which compensates for the current injected at the input node 601, and also establishes the input impedance of the receiver to match the input impedance of the audio cable/transmission line.

The input impedance of the receiver 600 matches $R_X$ when $R_T=(g_{m2}/g_{m1}+1)*R_X$ and the gain of amplifier 660 is high enough at the frequency of interest as to keep the inverting input 662 of the amplifier at a virtual ground, i.e., with zero AC current flowing into resistor 620. Thus, the input impedance of the receiver 600 depends on the transconductance ratio of the first and second current sources 630, 640 (which is easy to implement in an integrated circuit environment) and an absolute value $R_T$ for resistor 610. Resistor 610 can therefore be built out of a material with low enough resistivity for the application voltage and temperature variations. Alternatively, a compensation mechanism can be put in place, as shown and described with reference to FIG. 7 below.

For example, the input current $i_t$ across input nodes 601, 602 is given by equation (1) below, and therefore the voltage $v_t$ across the input nodes 601, 602 is given by equation (2):

$$i_t = -(N+1)*i_1 \quad (1)$$

$$v_t = -R_T*i_1 = -(N+1)*R_X*i_1 \quad (2)$$

Thus, the input impedance $Z_{in}$ for the receiver circuit 600 is given by equation (3):

$$Z_{in} = \frac{v_t}{i_t} = \frac{(N+1)*R_X*i_1}{(N+1)*i_1} = R_X \quad (3)$$

There is a linear relationship between the line input and the current generated by the voltage-controlled current sources. The maximum input current is set by the $V_{SET}$ of the voltage source. Thus, the current $I_1$ from the first current source 630 and the current $I_{OUT}$ from the third current source 650 are dependent on the input current $I_{IN}$:

$$I_1 = \frac{V_{SET}}{R_C} - I_{IN} * \frac{1}{N+1} \quad (4)$$

$$I_{OUT} = \left(\frac{k}{N+1}\right) * \frac{V_{SET}}{R_C} - I_{IN} \quad (5)$$

$$I_{1max} = \left(\frac{1}{N+1}\right) * \left(\frac{V_{SET}}{R_C} - I_{INmin}\right) \quad (6)$$

$$I_{1min} = \left(\frac{1}{N+1}\right) * \frac{V_{SET}}{R_C} - I_{INmax} \quad (7)$$

Figure 7:
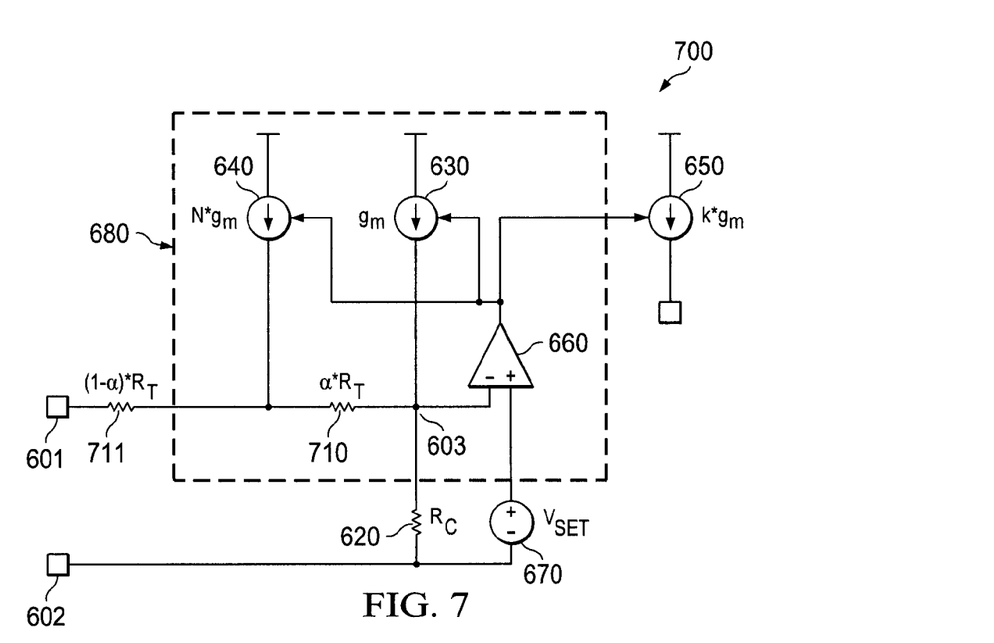
FIG. 7 is a circuit diagram illustrating the receiver circuit of FIG. 6 wherein the input line resistor is split into segments.

As noted above, the line receiver must be configured to accommodate audio cables having a characteristic impedance $Z_0$ ranging from 20 to 70 ohms. However, in application, the line receiver will always be associated with a known cable, meaning that the receiver input impedance can be set during system test. Thus, in one embodiment for tuning the input impedance, the $R_T$ resistor 610 of circuit 600 is broken up into segments or "taps" such as resistors 710 and 711 as shown in FIG. 7, for injecting the current from current source 640. Resistor 710 is inside the feedback loop 680 and has a value of $\alpha*R_T$, while resistor 711 is outside the feedback loop 680 in series with the input signal and has a value of $(1-\alpha)*R_T$. The ratio $\alpha$ of the resistance 710 inside the feedback loop to the total resistance $R_T$ is a linear function of the target input resistance $R_X$. Thus:

$$R_{IN} = \left(1 - \frac{N}{N+1} * \alpha\right) * R_T = R_X \quad (8)$$

$$\alpha = \left(1 + \frac{1}{N}\right) * \left(1 - \frac{R_X}{R_T}\right) \quad (9)$$

Figure 8:
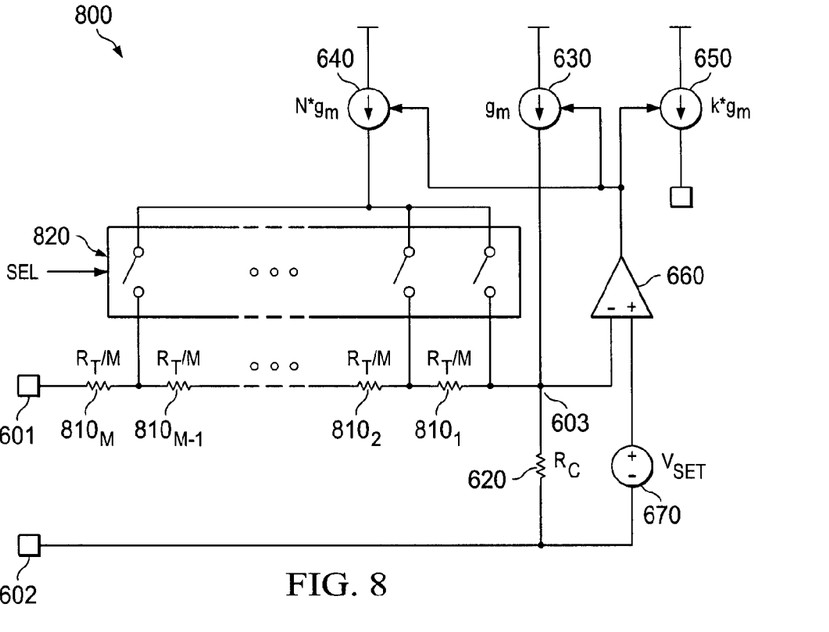
FIG. 8 is a circuit diagram illustrating the receiver circuit of FIG. 6 wherein the input line resistor is split into multiple segments selectable via a demultiplexor.

Referring now to FIG. 8, circuit 800 illustrates one practical example for implementing the adjustable input resistance shown conceptually in FIG. 7. In this embodiment, the $R_T$ resistor is split into an equal number M of equal taps consisting of resistances $810_1, 810_2 \ldots 810_M$. The current from the second current source 640 is distributed through a demultiplexer 820 to one of the taps 810. The selection of a particular tap is performed through a digital signal SEL applied to the demultiplexer 820, and the position of the selected tap sets the value of the parameter $\alpha$. The value of a can be set during the system test and stored in the control structure of the accessory, or an automatic input impedance system can be put in place.

Another way of adjusting the input impedance is to vary the $gm_2/gm_1$ transconductance ratio of the current sources 640, 630 through changing the scaling factor N.

5. Passive Mode Operation

Figure 9:
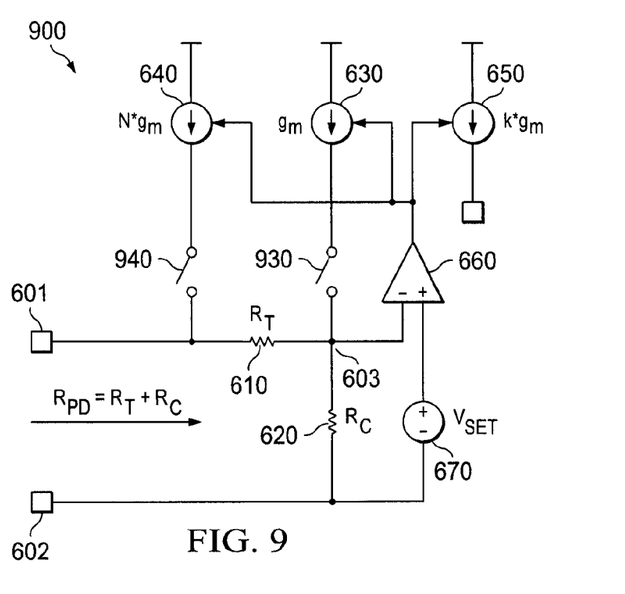
FIG. 9 is a circuit diagram illustrating the receiver circuit of FIG. 7 having switches to disable the feedback loop to provide a passive input impedance.

Sometimes a device is required to present a grounded resistance, for example, in a passive mode of operation. The feedback loop may be disabled in circuit 900 shown in FIG. 9 by disconnecting the voltage-controlled current sources 630, 640 from the circuit with switches 930, 940 respectively. The input impedance is then fixed at $R_{PD}=R_T+R_C$.

6. Data Recovery

Figure 10:
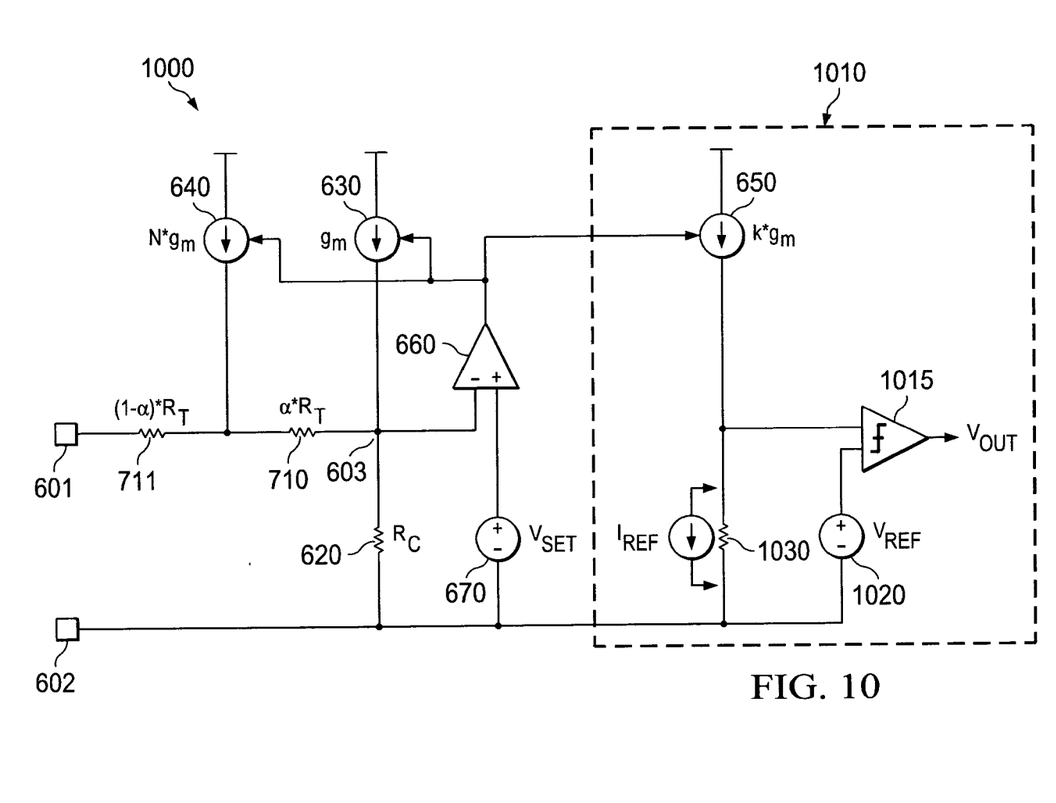
FIG. 10 is a circuit diagram illustrating the receiver circuit of FIG. 7 with a fixed reference for extracting the output signal.

Digital information is retrieved from the line signal presented at node 601 from the output current of current source 650, which is either converted to a voltage and compared to a reference voltage $V_{REF}$, or simply compared to a reference current $I_{REF}$. The reference current $I_{REF}$ has to be a set function of the minimum and maximum values of the line current. For example, FIG. 10 shows circuit 1000 that includes a current comparator circuit 1010. A comparator or slicer 1015 takes one input from the output of the third current source 650 and the other input from a voltage source 1020 having a reference voltage $V_{REF}$. A resistance 1030 is coupled between the output of the third current source 650 and ground, and a reference current $I_{REF}$ and output voltage $V_{RES}$ are developed across the resistance. By comparing the output voltage $V_{RES}$ with the reference voltage $V_{REF}$, or the output current of current source 650 with the current reference $I_{REF}$, the slicer 1015 regenerates the digital signal as it is encoded in the line current variations.

Figure 11:
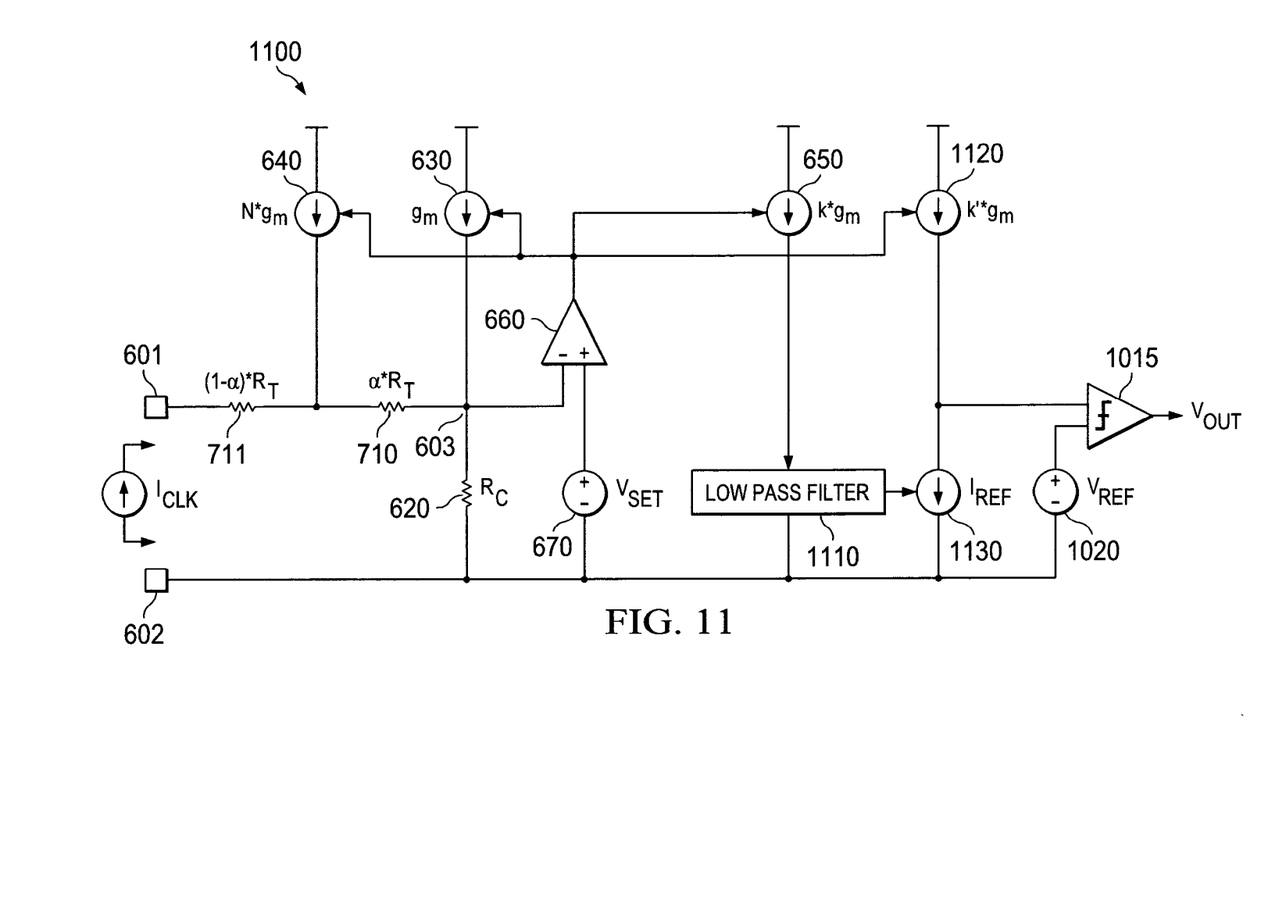
FIG. 11 is a circuit diagram illustrating the receiver circuit of FIG. 7 with an adaptive reference for extracting the output signal.

For a data signal with a constant duty cycle, such as a clock signal, or a DC balanced signal, such as a Manchester-encoded signal, the reference current can be derived from the data itself. In one example, the average value of the input signal can be used as the reference for the slicer. For example, FIG. 11 illustrates a circuit 1100 in which the output current of the third current source 650 is run through a low-pass filter 1110 to control the reference current IREF at source 1130. The reference current is then compared to a replica of the output current from a fourth current source 1120 having a transconductance $gm_4 = k'*g_m$ mhos.

Figure 12:
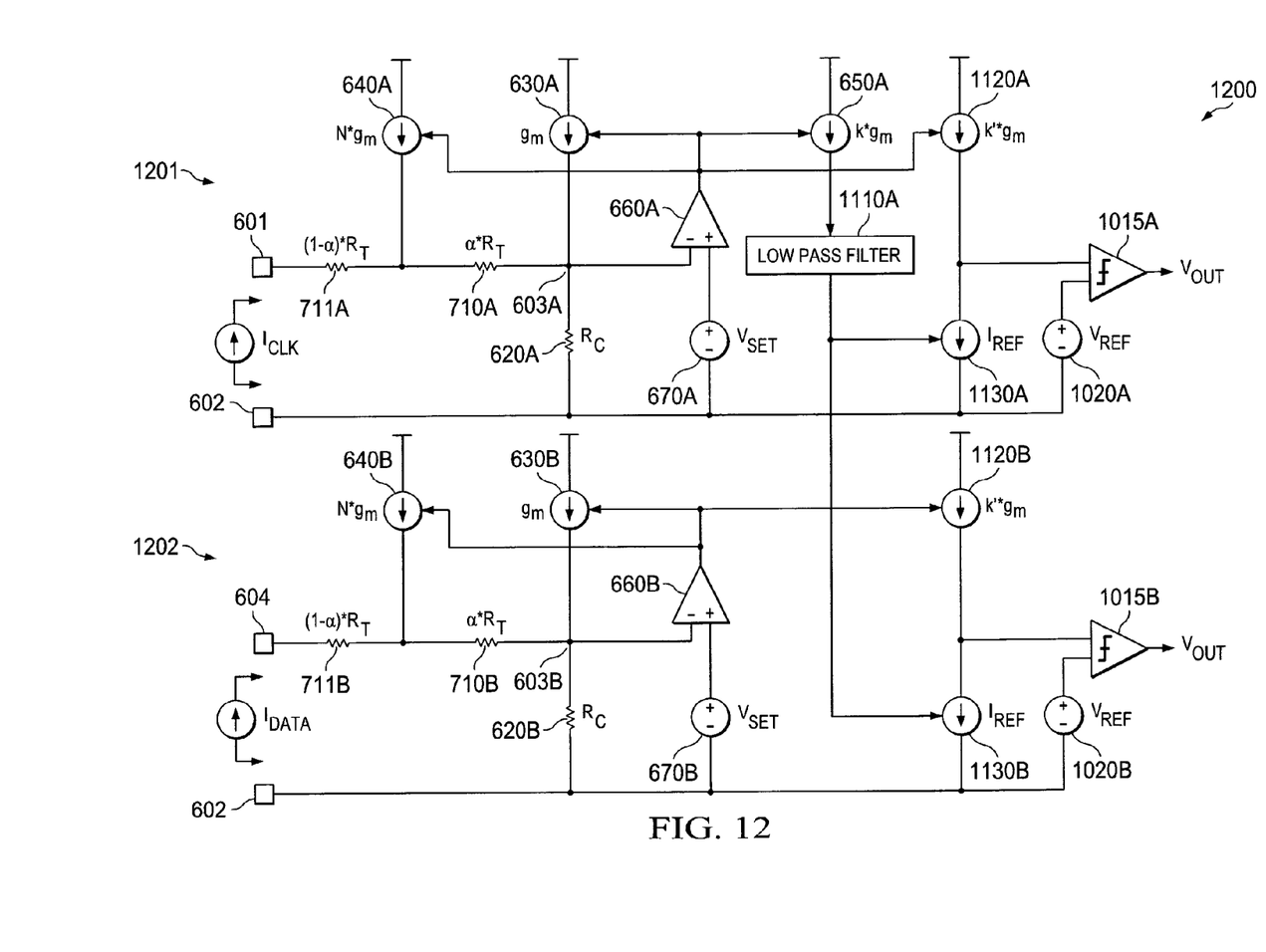
FIG. 12 is a circuit diagram illustrating a pair of receiver circuits as in FIG. 7, one used for a clock signal and one used for a data signal, with the adaptive reference from the clock signal used as a reference for extracting the data signal.

FIG. 12 illustrates the handling of two digital signals by circuit 1200, which connects to three conductors of a cable at nodes 601, 602 and 604, with node 602 coupled to the common or ground line of the cable. The top portion 1201 of circuit 1200 receives a input current $I_{CLK}$ as a clock signal between nodes 601, 602, and the bottom portion 1202 of circuit 1200 receives an input current $I_{DATA}$ as a data signal between nodes 604, 602. In this embodiment, the clock receiver circuit 1201 is the same as circuit 1100 described above and is used to recover the reference current $I_{REF}$ from the clock signal. The data receiver circuit 1202 is similar to circuit 1000, described above, except that the output of the low-pass filter 1110 of the clock receiver circuit 1201 can be used as the reference for current source 1130 in the data receiver circuit 1202.

7. Ground Line Conduction

Figure 13A:
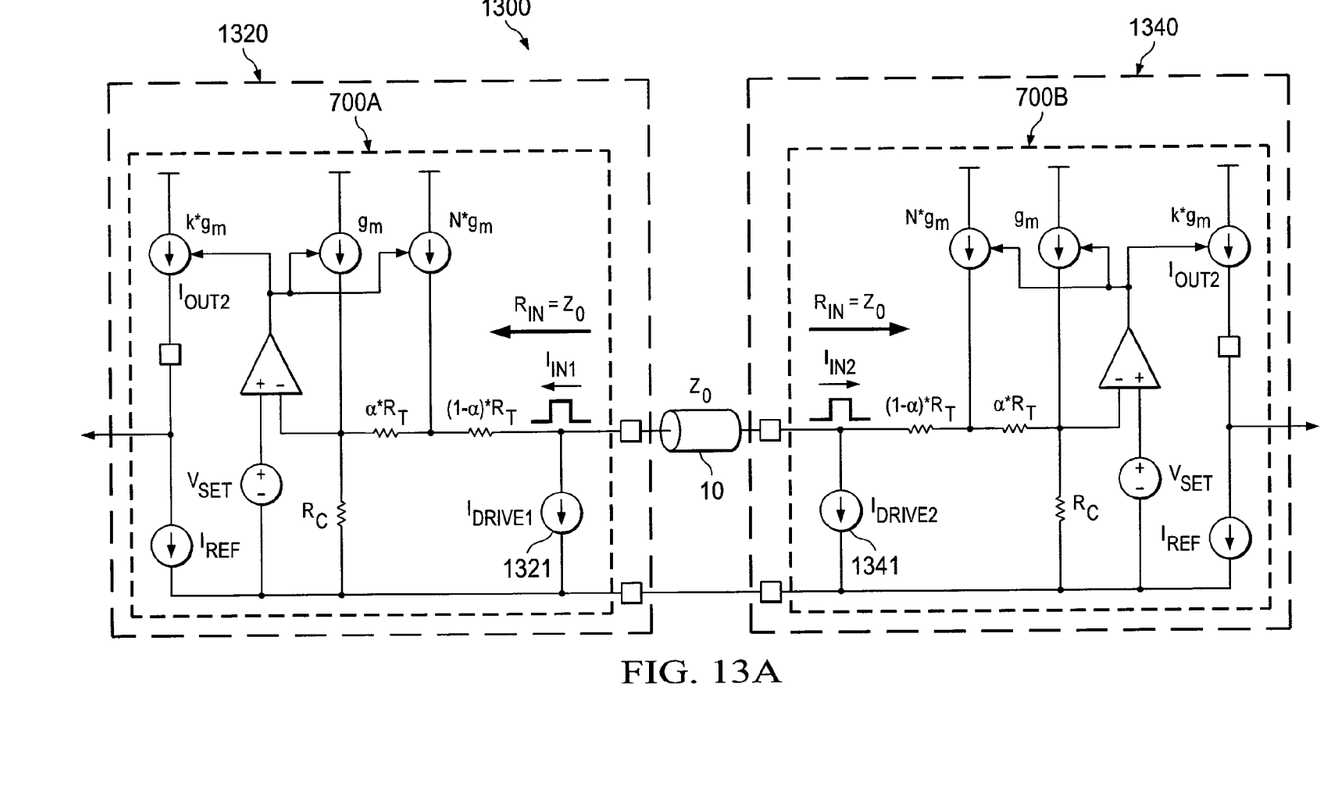
FIG. 13A is a circuit diagram illustrating a double-terminated, bidirectional current mode serial data link used to connect two digital devices.

The receiver embodiments described above can be utilized in a double terminated, bidirectional, current mode serial data link. For example, FIG. 13A illustrates a system 1300 in which bidirectional data communication may be carried out between a first digital device 1320 and a second digital device 1340 through a transmission line 10 of characteristic impedance $Z_0$. Each device 1320, 1340 incorporates at least one active impedance matching receiver for a digital signal implemented by identical mirror-image circuits 700A, 700B, respectively, described previously as circuit 700. In addition, each device 1320, 1340 includes a line driver, represented by current sources 1321 and 1341, respectively, for providing digital data as a series of current pulses. In system 1300, the devices 1320, 1340 may contain other circuitry for processing and control operations, and either or both devices may effectively initiate and receive transmissions of digital data using the receiver circuits described herein and reasonable variants thereof.

In an ideal environment, system 1300 would have no voltage drop on the ground line. Consider an example where first device 1320 is the transmitting device, and second device 1340 is the receiving device. Thus, the first device current source 1321 is on and generating high frequency current pulses, and the second device current source 1341 is off. The drive current $I_{DRIVE1}$ from the first device current source 1321 is equally distributed into each of the impedance matching receiver circuits 700A, 700B, and extracted from the second device 1340 as output current $I_{OUT2}$.

The output current $I_{OUT2}$ varies in proportion to the input pulses between $I_{OUTmin}$ and $I_{OUTmax}$, per equations (6) and (7):

$$I_{OUTmax} = \left(\frac{k}{N+1}\right) * \frac{V_{SET}}{R_C} - I_{INmin}; \text{ and}$$

-continued
$$I_{OUTmin} = \left(\frac{k}{N+1}\right) * \frac{V_{SET}}{R_C} - I_{INmax}.$$

Figure 14A:
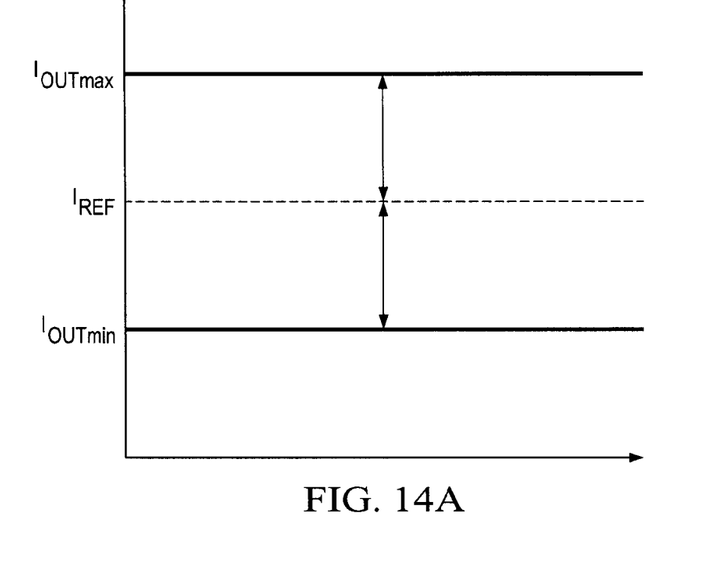
FIG. 14A is a graph showing the values of minimum drive current and maximum drive current compared to a reference current.

Thus, since the reference $I_{REF}$ is typically set as the average value of the current, the operating margins for $I_{OUTmin}$ and $I_{OUTmax}$ are balanced around $I_{REF}$ as shown in FIG. 14A.

Figure 13B:
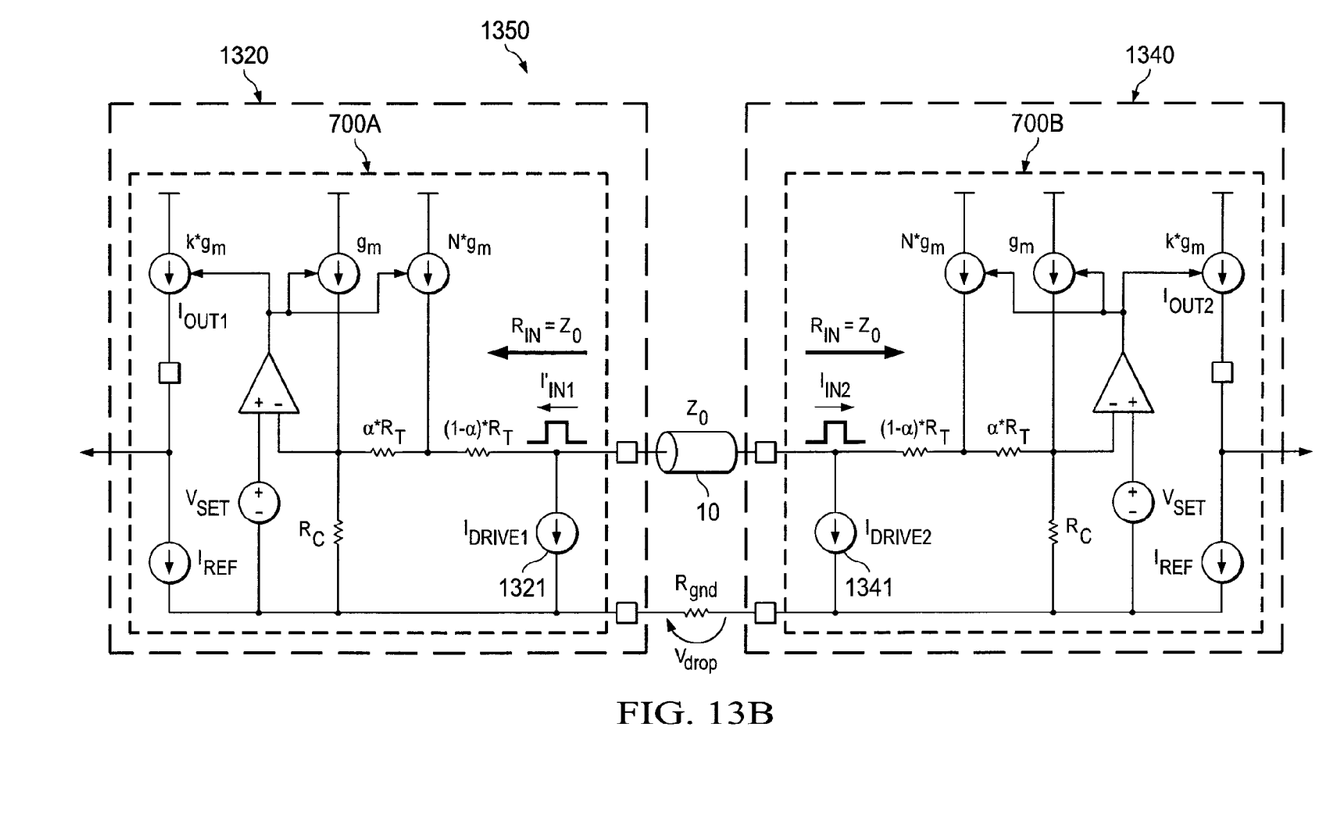
FIG. 13B is a circuit diagram illustrating the data link of FIG. 13A having a voltage drop on the ground line.

However, in many applications, an accessory device (e.g., a headset) receives power from the controller device (e.g., a smartphone), and the ground line may therefore conduct a large return current from the operation of circuitry within the accessory device, e.g, on the order of tens of milliamps, that may have a significant impact on circuit operation. For example, FIG. 13B illustrates circuit 1350, which is the same as circuit 1300 except for the additional of a resistance $R_{gnd}$ on the ground line to represent the slowly varying voltage drop $V_{drop}$ on the return (ground) line. This variable voltage drop across the finite resistance ground line will disturb the signal on the data lines. In the case of an audio cable application, where large currents are drawn by the audio circuitry, e.g., by CODEC or headphone amplifier, the ground bounce $V_{drop}$ can reach values of tens of millivolts. Thus, the modified line current $I'_{IN}$ in view of the voltage drop on the ground line is given by:

$$I'_{IN} = \frac{1}{2} * I_{DRIVE2} + \frac{1}{2} * \frac{V_{drop}}{2R_X}$$

Substituting this value in equations (6) and (7) leads to the following values for $I_{OUT1min}$ and $I_{OUT1max}$:

$$I_{OUTmin} = \left(\frac{k}{N+1}\right) * \left(\frac{V_{SET}}{R_C} - \frac{1}{2} * I_{IN2} - \frac{V_{drop}}{2R_X}\right);$$

$$I_{OUTmax} = \left(\frac{k}{N+1}\right) * \left(\frac{V_{SET}}{R_C} - \frac{V_{drop}}{2R_X}\right);$$

Figure 14B:
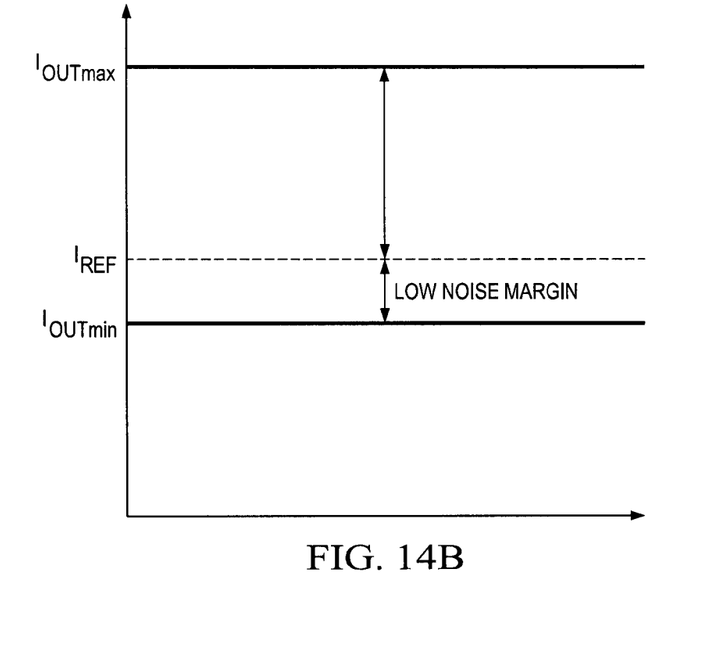
FIG. 14B is a graph similar to FIG. 14A showing the shift in minimum and maximum drive currents due to a voltage drop on the ground line.

Thus, the operating margins for $I_{OUTmin}$ and $I_{OUTmax}$ are skewed as shown in FIG. 14B, with a low noise margin near the minimum current because the voltage is not zero on the ground line.

One solution to compensate for the effect of $V_{drop}$ is to lift the lower voltage of the equivalent impedance at the receiver side. This enables the average value of the voltage $V'_C$ at node 1305 to be adjusted to be equal to the reference value $V_C$. This can be accomplished by providing a feedback loop that either lifts the voltage of the common node of $V_{SET}$ and $R_C$, or changes the $V_{SET}$ in such a way as to compensate for the extra current in the line due to $V_{drop}$.

Figure 15:
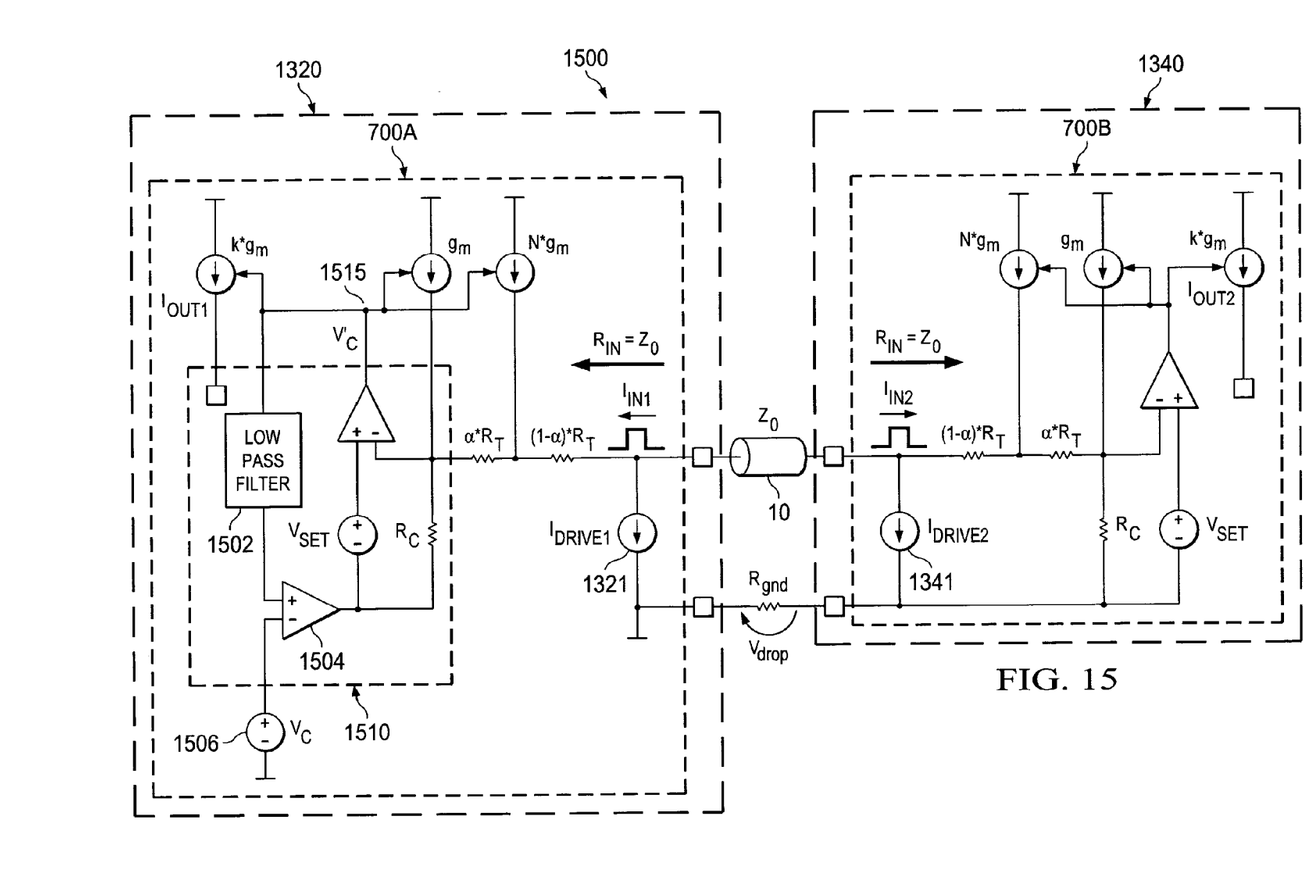
FIG. 15 is a circuit diagram illustrating one solution to the problem of voltage drop on the ground line.

For example, FIG. 15 illustrates a circuit 1500 having a feedback loop 1510 for lifting up the voltage so that $V'_C = V_C$. The feedback loop 1510 includes a low pass filter 1502 that receives the voltage $V'_C$ and passes the filtered signal to the non-inverting input of differential amplifier 1504. Another voltage supply 1506 generates reference voltage $V_C$, which is provided to the inverting input of the differential amplifier 1504 and operates with the feedback to lift up the voltage at node 1505.

Figure 16:
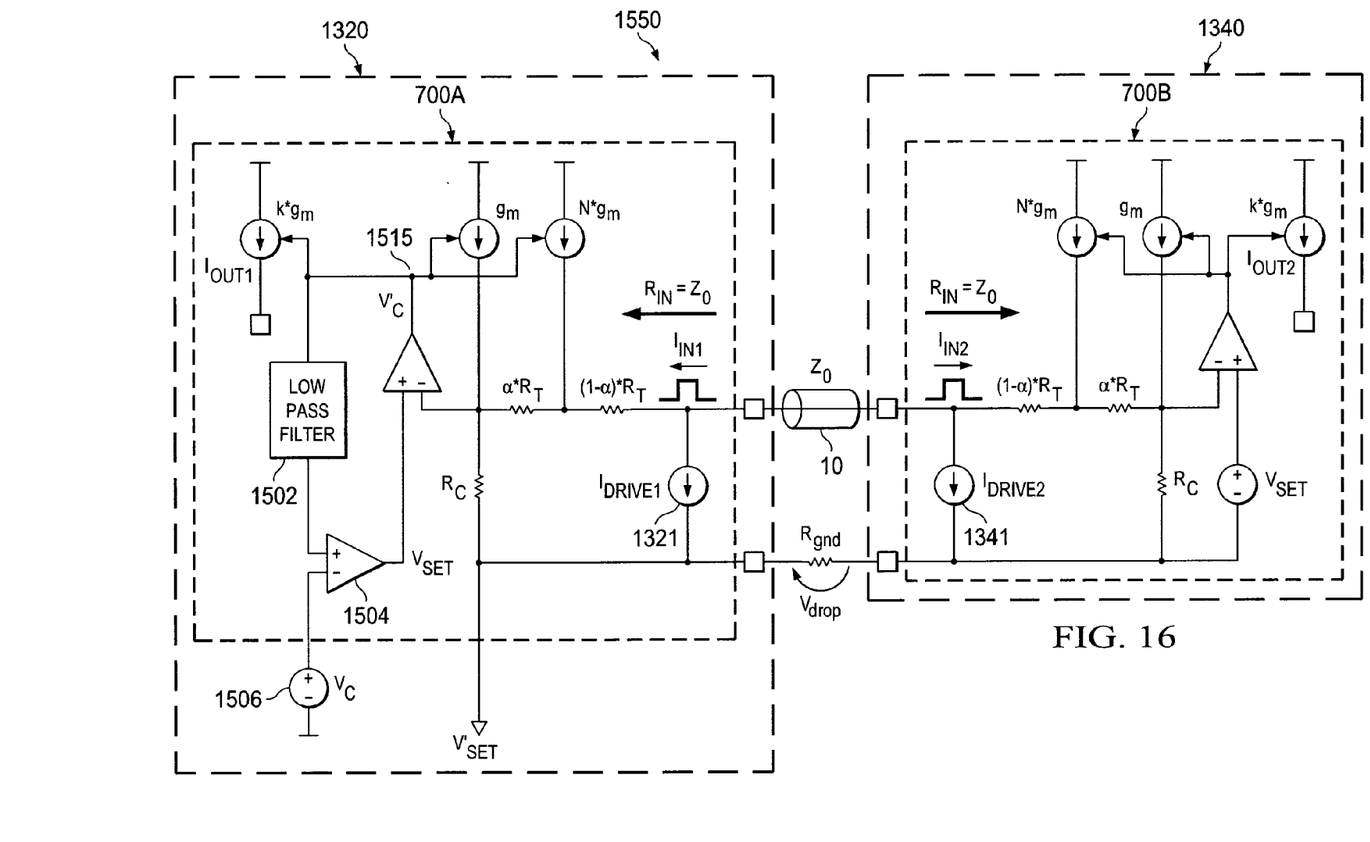
FIG. 16 is a circuit diagram illustrating another solution to the problem of voltage drop on the ground line.

In another example, FIG. 16 illustrates a circuit 1550 that is similar to circuit 1500, except that $V_{SET}$ is modified to compensate for the extra current due to $V_{drop}$.

While one or more implementations have been described by way of example and in terms of the specific embodiments, it is to be understood that the one or more implementations are not limited to the disclosed embodiments. To the contrary, this disclosure is intended to cover various modifications and similar arrangements as would be apparent to those skilled in the art. Therefore, the scope of the appended claims should be accorded the broadest reasonable interpretation so as to encompass all such modifications and similar arrangements.

The invention claimed is:

1. A circuit for receiving digital signals over a transmission line with a characteristic transmission-line impedance, comprising:
a first input node configured to receive digiral signal as an input current;
a second input node configured to provide a common line connection for the digital signal;
a first current source controlled by a first voltage and having an output coupled to a first internal node, the first current source having a first transconductance;
a second current source controlled by the first voltage and having an output coupled to the first input node, the second current source having a second transconductance equal to the first transconductance times a first scaling factor;
a first resistance element coupled between the first input node and the first internal node, the first resistance element having a resistance equal to the scaling factor plus one, times the characteristic transmission-line impedance; and
a first differential amplifier having a first input coupled to the first internal node and a second input configured for receiving a first reference voltage with respect to the second input node, the first differential amplifier generating the first voltage as an output to control each of the first and second current sources;
a second resistance element coupled between the first internal node and the second input node; and
a third current source controlled by the first voltage and having an output coupled to an output node, the third current source configured to have a third transconductance equal to the first transconductance times a second scaling factor, wherein an output current having a linear dependence on the input current is generated at the output node.

2. The circuit of claim 1, wherein the first resistance is split into two resistance segments, a first of the resistance segments connected between the first input node and a second internal node located at the output of the second current source, and a second of the resistance segments connected between the second internal node and the first internal node.

3. The circuit of claim 1, wherein the first resistance is split into a plurality of resistance segments, further comprising:
a plurality of tap lines, each tap line coupled at one end thereof to the output of the second current source and at the other end thereof between adjacent resistance segments; and
a switching device having a plurality of switches, each switch coupled between each tap line and the output of the second current source.

4. The circuit of claim 3, wherein the switching device is a demultiplexor.

5. The circuit of claim 1, further comprising:
a first switch coupled between the first current source and the first internal node; and
a second switch coupled between the second current source and the first input node,
wherein opening the first and second switches disconnects the first and second current sources from the circuit and enables the circuit to present a passive impedance.

6. The circuit of claim 1, further comprising:
a third resistance element coupled between the output of the third current source and the second input node; and
a comparator having a first input coupled to the output node and a second input configured to receive a second reference voltage with respect to the second input node, wherein the comparator generates a digital output signal that corresponds to transitions of an input signal presented between the first input node and the second input node.

7. The circuit of claim 1, further comprising:
a first low pass filter coupled to the output of the third current source;
a fourth current source controlled by the first voltage and having an output coupled to a third internal node, the fourth current source configured to have a fourth transconductance equal to the first transconductance times a third scaling factor;
a fifth current source controlled by the output of the low pass filter and generating a reference current, an output of the fifth current source coupled to the third internal node; and
a comparator having a first input coupled to the third internal node and a second input configured to receive a second reference voltage with respect to the second input node, wherein the comparator generates a digital output signal that corresponds to transitions of an input signal presented between the first input node and the second input node.

8. The circuit of claim 7, further comprising:
a second low pass filter having an input and an output, the input coupled to the output of the first differential amplifier; and
a second differential amplifier having a first input coupled to the output of the second low pass filter, a second input configured to receive a third reference voltage with respect to a ground source, and an output;
wherein the second resistance is coupled between the first internal node and the output of the second differential amplifier, and wherein the first reference voltage is referenced to the output of the second differential amplifier.

9. The circuit of claim 7, further comprising:
a second low pass filter having an input and an output, the input coupled to the output of the first differential amplifier; and
a second differential amplifier having a first input coupled to the output of the second low pass filter, a second input configured to receive a third reference voltage with respect to a ground source, the second differential amplifier generating the first reference voltage as an output, and the second input of the first differential amplifier is coupled to the output of the second differential amplifier.

10. A circuit for receiving digital signals from a transmission line having a characteristic transmission-line impedance, comprising:
a first current source controlled by a first voltage and having an output coupled to a first internal node, the first current source having a first transconductance;
a second current source controlled by the first voltage and having an output coupled to the first input node, the second current source having a second transconductance equal to the first transconductance times a first scaling factor;
a third current source controlled by the first voltage and having an output coupled to an output node, the third current source configured to have a third transconductance equal to the first transconductance times a second scaling factor, wherein an output current having a linear dependence on an input current corresponding to the digital signals is generated at the output node;

a first resistance element coupled between the first input node and the first internal node, the first resistance element having a resistance equal to the scaling factor plus one, times the characteristic transmission-line impedance;

a second resistance element coupled between the first internal node and a second input node, the second input node configured for coupling the circuit to a common line for the digital signal; and a differential amplifier having a first input coupled to the first internal node and a second input configured to receive a first reference voltage with respect to the second input node, the differential amplifier generating the first voltage output to control each of the first and second current sources.

11. The circuit of claim 10, wherein the first resistance is split into two resistance segments, a first of the resistance segments connected between the first input node and a second internal node located at the output of the second current source, and a second of the resistance segments connected between the second internal node and the first internal node.

12. The circuit of claim 10, wherein the first resistance is split into a plurality of resistance segments, further comprising:
a plurality of tap lines, each tap line coupled at one end thereof to the output of the second current source and at the other end thereof between adjacent resistance segments; and
a switching device having a plurality of switches, each switch coupled between each tap line and the output of the second current source.

13. The circuit of claim 10, further comprising:
a third resistance element coupled between the output of the third current source and the second input node; and
a comparator having a first input coupled to the output of the third current source and a second input configured to receive a second reference voltage with respect to the second input node, wherein the comparator generates an output signal that corresponds to transitions of an input signal presented between the first input node and the second input node.

14. The circuit of claim 10, further comprising:
a first low pass filter coupled to the output of the third current source;
a fourth current source controlled by the first voltage and having an output, the fourth current source configured to have a fourth transconductance equal to the first transconductance times a third scaling factor;
a fifth current source controlled by the output of the low pass filter and generating a reference current as an output; and
a comparator having a first input coupled to the outputs of the fourth and fifth current sources and a second input configured to receive a second reference voltage with respect to the second input node, wherein the comparator generates an output signal that corresponds to transitions of an input signal presented between the first input node and the second input node.

15. The circuit of claim 14, further comprising:
a second low pass filter having an input and an output, the input coupled to the output of the first differential amplifier; and
a second differential amplifier having a first input coupled to the output of the second low pass filter, a second input configured to receive a third reference voltage with respect to a ground source, and an output;
wherein the second resistance is coupled between the first internal node and the output of the second differential amplifier, and wherein the first reference voltage is referenced to the output of the second differential amplifier.

16. The circuit of claim 14, further comprising:
a second low pass filter having an input and an output, the input coupled to the output of the first differential amplifier; and
a second differential amplifier having a first input coupled to the output of the second low pass filter, a second input configured to receive a third reference voltage with respect to a ground source, the second differential amplifier generating the first reference voltage as an output, and the second input of the first differential amplifier is coupled to the output of the second differential amplifier.

17. A circuit for receiving digital signals from a transmission line having a characteristic transmission-line impedance, comprising:
a first voltage-controlled current source coupled to an internal node;
a second voltage-controlled current source coupled to a first input node;
a first resistance element coupled between the first input node and the internal node;
a differential amplifier having a first input coupled to the internal node and a second input configured to receive a first reference voltage with respect to a second input node, the differential amplifier generating a voltage output to control each of the first and second current sources;
wherein the first voltage-controlled current source has a first transconductance, the second voltage-controlled current source has a second transconductance equal to the first transconductance times a first scaling factor, and the first resistance element has a resistance equal to the scaling factor plus one, times the characteristic transmission-line impedance,
a second resistance element coupled between the internal node and a common line; and
a third voltage-controlled current source having an output coupled to an output node, wherein the third voltage-controlled current source has a third transconductance equal to the first transconductance times a second scaling factor and is controlled by the voltage output of the differential amplifier to generate an output signal that corresponds to transitions of an input signal presented between the first external node and the second external node.

18. The circuit of claim 17, wherein the first resistance is split into a plurality of resistance segments, further comprising:
a plurality of tap lines, each tap line coupled at one end thereof to the output of the second voltage-controlled current source and at the other end thereof between adjacent resistance segments; and
a switching device having a plurality of switches, each switch coupled between each tap line and the output of the second current source.

* * * * *